(12) United States Patent
Xu

(10) Patent No.: US 9,651,843 B2
(45) Date of Patent: May 16, 2017

(54) THIN FILM TRANSISTOR ARRAY SUBSTRATE AND MANUFACTURING METHOD THEREOF

(71) Applicant: Shenzhen China Star Optoelectronics Technology Co., Ltd., Shenzhen, Guangdong (CN)

(72) Inventor: Xiangyang Xu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 14/888,416

(22) PCT Filed: Jun. 10, 2015

(86) PCT No.: PCT/CN2015/081163
§ 371 (c)(1),
(2) Date: Oct. 30, 2015

(87) PCT Pub. No.: WO2016/161700
PCT Pub. Date: Oct. 13, 2016

(65) Prior Publication Data
US 2017/0017103 A1    Jan. 19, 2017

(30) Foreign Application Priority Data

Apr. 9, 2015 (CN) .......................... 2015 1 0166111

(51) Int. Cl.
*H01L 29/04* (2006.01)
*G02F 1/1368* (2006.01)
(Continued)

(52) U.S. Cl.
CPC ........ *G02F 1/1368* (2013.01); *G02F 1/13439* (2013.01); *G02F 1/136209* (2013.01); *G02F 1/136227* (2013.01); *H01L 27/1248* (2013.01); *H01L 29/4908* (2013.01); *H01L 29/66969* (2013.01); *H01L 29/78633* (2013.01); *H01L 29/78648* (2013.01); *H01L 29/78693* (2013.01);
(Continued)

(58) Field of Classification Search
None
See application file for complete search history.

(56) References Cited

U.S. PATENT DOCUMENTS

2015/0069510 A1* 3/2015 Du .................. H01L 27/124
257/347

* cited by examiner

*Primary Examiner* — Jack Chen
(74) *Attorney, Agent, or Firm* — Andrew C. Cheng

(57) ABSTRACT

A thin film transistor array substrate comprises a bottom gate disposed on a substrate and a bottom gate insulating layer covering the bottom gate, a semiconductor oxide layer disposed on the bottom gate insulating layer and an etch blocking layer covering the semiconductor oxide layer and including a first via, a drain disposed on the etch blocking layer contacting with the semiconductor oxide layer through the first via and an insulating protection layer covering the drain, a second via arranged in the insulating protection layer, the etch blocking layer and the bottom gate insulating layer, a top gate disposed on insulating protection layer contacting with the bottom gate through the second via. The disclosure further discloses a method for manufacturing a thin film transistor array substrate. The thin film transistor of the disclosure prevents the threshold voltage thereof from being drifted in a case of negative bias illumination stress (NBIS).

7 Claims, 2 Drawing Sheets

(51) Int. Cl.
*H01L 27/12* (2006.01)
*H01L 29/786* (2006.01)
*H01L 29/49* (2006.01)
*H01L 29/66* (2006.01)
*G02F 1/1343* (2006.01)
*G02F 1/1362* (2006.01)

(52) U.S. Cl.
CPC .............. *G02F 2001/13685* (2013.01); *G02F 2201/123* (2013.01); *G02F 2202/10* (2013.01)

THIN FILM TRANSISTOR ARRAY SUBSTRATE AND MANUFACTURING METHOD THEREOF

BACKGROUND

Technical Field

The disclosure is related to display technology field, and more particular to a thin film transistor array substrate and a manufacturing method thereof being able to prevent the threshold voltage (Vth) from drifting in a case of the negative bias illumination stress (NBIS).

Related Art

With the evolution of optical and semiconductor technology, the flat panel display has been flourishing. Among the various flat panel displays, the liquid crystal display (abbreviated LCD) has become the mainstream on the market due to due to the various superior characteristics such as the high space utilization efficiency, low power consumption, no radiation and low electromagnetic interference.

The liquid crystal display device usually comprises a liquid crystal display panel and a backlight module arranged opposite to each other. The backlight module provides display light to the liquid crystal display panel. The liquid crystal display panel usually comprises a thin film transistor array substrate, a color filter substrate, and a liquid crystal layer sandwiched between these two substrates. The image display is achieved by applying voltages to these two substrates to further control the rotation of the liquid crystal molecules in the liquid crystal layer to achieve light passing or not passing.

The thin film transistor array substrate comprises various thin film transistors formed in an array on a substrate. Compared with the conventional a-Si thin film transistors, the a-IGZO thin film transistors have the advantages of higher electron mobility, low preparation capabilities, excellent preparation of large area uniformity, good transparency for visible light, higher on/off ratio and low threshold voltage (Vth). The a-IGZO TFT becomes the preferable switching element for the active matrix display in recent years. However, under the situation of negative bias illumination stress (NBIS), the threshold voltage of the a-IGZO TFT is easily to drift. Therefore it is difficult for the a-IGZO TFT to achieve large-scale production.

SUMMARY

In order to solve the above problems of the prior art, an object of the invention to provide a thin film transistor array substrate and a manufacturing method thereof, being able to prevent the threshold voltage thereof from drifting in a case of negative bias illumination stress (NBIS).

According to an aspect of the disclosure, there is provided a thin film transistor array substrate, which includes: a bottom gate of a thin film transistor, disposed on a substrate; a bottom gate insulating layer, disposed on the substrate and covered the bottom gate; a semiconductor oxide layer, disposed on the bottom gate insulating layer; an etch blocking layer, disposed on the bottom gate insulating layer and covering the semiconductor oxide layer, wherein the etch blocking layer comprises a first via, a portion of the semiconductor oxide layer is exposed through the first via; a drain and a source of the thin film transistor, disposed on the etch blocking layer, the drain contacts with the semiconductor oxide layer through the first via; an insulating protection layer, disposed on the etch blocking layer and covering the drain and source; a second via, arranged in the insulating protection layer, the etch blocking layer and the bottom gate insulating layer, a portion of the bottom gate is exposed through the second via; a top gate, disposed on the insulating protection layer and the top gate contacts with the bottom gate through the second via.

Further, the semiconductor oxide layer comprises an amorphous indium gallium zinc oxide.

Further, the bottom gate comprises at least one metal material.

Further, the materials used by the top gate and a pixel electrode are the same.

Further, the materials used by the top gate and a pixel electrode are the same.

Further, the pixel electrode comprises an indium tin oxide.

Further, the pixel electrode comprises an indium tin oxide.

According to another aspect of the disclosure, there is provided a manufacturing method of a thin film transistor array substrate, which includes: forming a bottom gate of a thin film transistor on a substrate; forming a bottom gate insulating layer covered the bottom gate on the substrate; forming a semiconductor oxide layer on the bottom gate insulating layer; forming an etch blocking layer covering the semiconductor oxide layer on the bottom gate insulating layer; forming a first via in the etch blocking layer, such that a portion of the semiconductor oxide layer is exposed through the first via; forming a drain and a source of the thin film transistor on the etch blocking layer, such that the drain contacts with the semiconductor oxide layer through the first via; forming a insulating protection layer covering the drain and source on the etch blocking layer; forming a second via arranged in the insulating protection layer, the etch blocking layer and the bottom gate insulating layer, such that a portion of the bottom gate is exposed through the second via; forming a top gate on the insulating protection layer, such that the top gate contacts with the bottom gate through the second via.

Further, the semiconductor oxide layer is formed by using an amorphous indium gallium zinc oxide.

Further, the bottom gate is formed by using at least one metal material.

Further, the top gate and a pixel electrode are formed simultaneously by using a transparent conductive material.

Further, the top gate and a pixel electrode are formed simultaneously by using a transparent conductive material.

Further, the top gate and the pixel electrode are formed simultaneously by using an indium tin oxide.

Further, the top gate and the pixel electrode are formed simultaneously by using an indium tin oxide.

The beneficial effects of the disclosure: in a case of the negative bias illumination stress (NBIS), a thin film transistor formed on the substrate prevents the threshold voltage thereof from drifting, thus increasing the reliability of the thin film transistor, and thus increasing the display quality of the LCD display panel.

BRIEF DESCRIPTION OF THE DRAWINGS

The following description in conjunction with the accompanying drawings, the above and other aspects, features and advantages of embodiments of the disclosure will become more apparent, in drawings.

DETAILED DESCRIPTION

Figure 1:
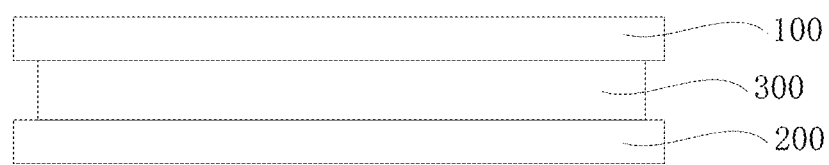
FIG. 1 shows a side view of a liquid crystal display panel according to an embodiment of the disclosure.

Hereinafter, embodiments of the disclosure will be described in detail with the accompanying drawings. However, the disclosure may be achieved in many different forms, and the disclosure should not be construed as limited to the specific embodiments set forth herein. Rather, these embodiments are provided to explain the principles of the invention and its practical application, so that others skilled in the art may understand the invention for various embodiments and various modifications suited to the particular intended application. In the drawings, in order to clearly illustrate the component, the thickness of layers and regions are exaggerated. The same reference numerals throughout the specification and drawings can be used to denote the same elements. It also should be understood that when a layer or element is referred to as being formed "on" another layer or substrate, it can be formed directly on the other layer or substrate, or intermediate layers may also be present.

FIG. 1 shows a side view of a liquid crystal display panel according to an embodiment of the disclosure.

Refer to FIG. 1, according to an embodiment of the disclosure, the liquid crystal display panel includes a color filter substrate 100, a thin film transistor array substrate 200 and a liquid crystal layer 300 disposed between the color filter substrate 100 and the thin film transistor array substrate 200.

The liquid crystal layer 300 includes several liquid crystal molecules. The color filter substrate 200 disposed opposite to the thin film transistor array substrate 100 is also known as a CF (Color Filter) substrate, which typically includes a substrate (such as a transparent glass substrate, PET substrate) and a black matrix pattern, a color filter layer (such as red (R), green (G) and blue (B) filter pattern) and an alignment layer disposed on the substrate. Since the color filter substrate 100 according to the embodiment of the disclosure is substantially the same as the color filter substrate of the present liquid crystal display, and therefore the specific structure of the disclosure may refer to the related description in the present technique literature, and the description is omitted.

Figure 2:
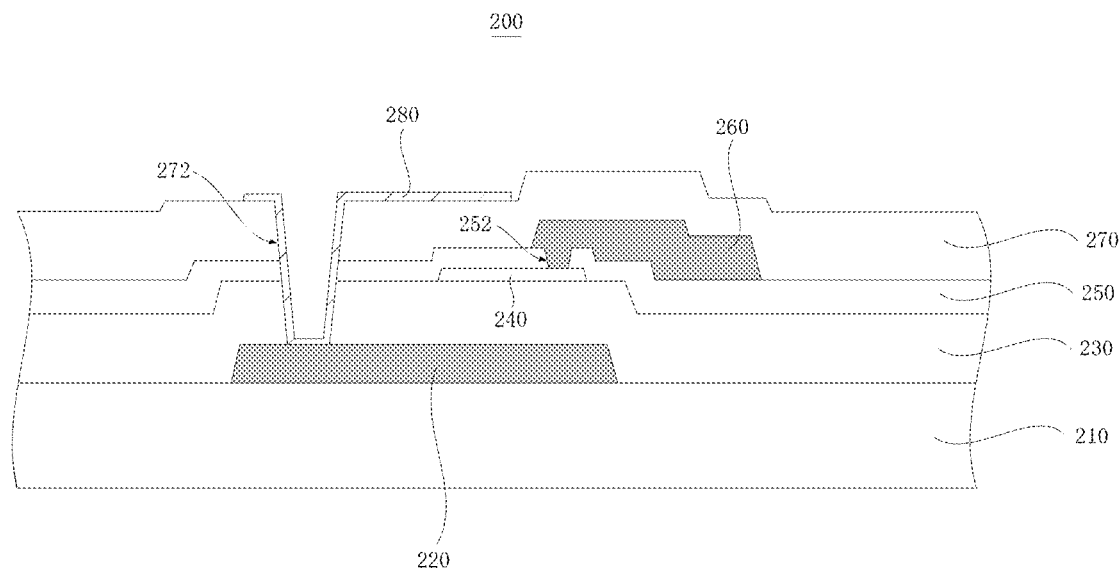
FIG. 2 shows a sectional view of a thin film transistor array substrate of an embodiment of the disclosure.
Figure 3:
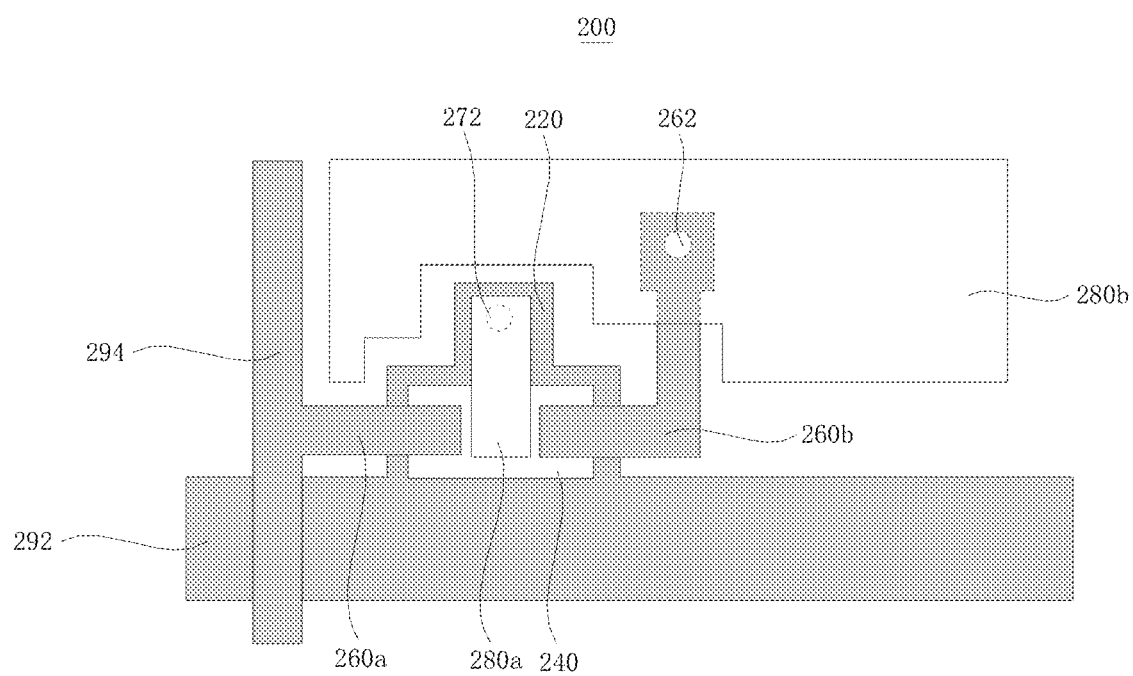
FIG. 3 shows a top view of a thin film transistor array substrate according to an embodiment of the disclosure.

FIG. 2 shows a sectional view of a thin film transistor array substrate of an embodiment of the disclosure. FIG. 3 shows a top view of a thin film transistor array substrate according to an embodiment of the disclosure.

Refer to FIG. 2, according to an embodiment of the disclosure, the thin film transistor array substrate 200 is also known as a TFT (Thin Film Transistor) substrate, which includes a substrate 210, bottom gate 220, a bottom gate insulating layer 230, a semiconductor oxide layer 240, an etch blocking layer 250, a source 260a and a drain 260b, an insulating protection layer 270, and a top gate 280a.

The substrate 210 may be, for example, a transparent glass substrate or a PET substrate, but the disclosure is not limited thereto.

In the present embodiment, the bottom gate 220 is patterned to be formed on the substrate 210, wherein while the bottom gate 220 is patterned to be formed on the substrate 210, a scanning signal line 292 for receiving a scanning signal is also patterned to be formed on the substrate 210. Here, the bottom gate 220 and the scanning line 292 is formed by using at least one metal material, such as one or more of aluminum, molybdenum, copper or the like. Preferably, the metal material included by the bottom gate 220 and the metal material included by the scanning line are the same, so that both can be easily formed simultaneously.

The bottom gate insulating layer 230 is formed on the substrate 210, and the bottom gate insulating layer 230 covers the bottom gate 220. Here, the bottom gate insulating layer 230 may include silicon nitride (SiNx)/silicon dioxide (SiO2) or SiO2 or SiNx/silicon oxynitride (SiON)/SiO2, but the disclosure is not limited thereto.

The semiconductor oxide layer 240 is patterned to be formed on the bottom gate insulating layer 230. Here, the semiconductor oxide layer 240 may include an amorphous indium gallium zinc oxide (a-IGZO). The amorphous indium gallium zinc oxide uses the amorphous zinc oxide (ZnO) as a main component, and is doped with gallium (Ga) and indium (In).

The etch blocking layer 250 is formed on the bottom gate insulating layer 230, and the etch blocking layer 250 covers the semiconductor oxide layer 240. A portion of the etch blocking layer 250 may be removed, for example, by an etching process, so that the first via 252 is formed. For example, a portion of the etch blocking layer 250 may be removed, so that a portion of the upper surface of the semiconductor oxide layer 240 is exposed through the corresponding first via 252. Here, the etch blocking layer 250 may include SiO2, but the disclosure is not limited thereto.

The drain 260b and the source 260a are patterned to be formed on the etch blocking layer 250, and a data line 294 for receiving a data signal is also patterned to be formed on the etch blocking layer 250 at the same time, wherein the data line 294 is connected with the source 260a. A portion of the drain 260b may be filled with the first via 252, for example, directly contacts with the semiconductor oxide layer 240. The drain 260b of the thin film transistor is directly contacted with the semiconductor oxide layer 240 through the first via 252.

The insulating protection layer 270 is formed on the etch blocking layer 250, and the insulating protection layer 270 covers the drain 260b. Here, the insulating protection layer 270 may include SiNx/SiO2 or SiO2, but the disclosure is not limited thereto.

A portion of the insulating protection layer 270, a portion of the etch blocking layer 250 and a portion of the bottom gate insulating layer 230 may be removed, for example, by an etching process, so that the second via 272 is formed. For example, the portion of the insulating protection layer 270, the portion of the etch blocking layer 250 and the portion of bottom gate insulating layer 230 may be removed, so that a portion of a upper surface of the bottom gate 220 is exposed through the corresponding second via. In other words, the second via 272 penetrates the insulating protection layer 270, the etch blocking layer 250 and the bottom gate insulating layer 230, so that the portion of the upper surface of the bottom gate 220 is exposed.

The top gate 280a is patterned to be formed on the insulating protection layer 270. A portion of the top gate 280a may be filled with the second via 272, for example, directly contacted with the bottom gate 220. The top gate 280a of the thin film transistor is directly contacted with the bottom gate 220 through the second via 272. Here, it should be noted that the material used for forming the top gate 280a of the thin film transistor and the material used for forming the pixel electrode 280b are the same. For example, the top gate 280a of the thin film transistor and the pixel electrode 280b are formed by using a transparent conductive film (the indium tin oxide, ITO). That is, while the pixel electrode 280b is formed by using the material such as ITO, the top gate 280a of the thin film transistor is formed. However, it should be understood that since the pixel electrode 280b directly contacts with the drain 260b through the third via 262, and the top gate 280a of the thin film transistor directly contacts with the bottom gate 220, so the pixel electrode does not contact with the top gate 280a.

In summary, in a case of the negative bias illumination stress (NBIS), the ta-IGZO TFT according to the embodiment of the disclosure prevents the threshold voltage thereof from drifting, thus increasing the reliability of the a-IGZO TFT, and thus increasing the display quality of the LCD display panel.

Although reference to particular embodiments shown and described the disclosure, those skilled in the art will understand: without departing from the spirit and scope of the appended claims and their equivalents of the disclosure, the form can be carried out in this and various changes in detail.

What is claimed is:

1. A thin film transistor array substrate, comprising:
   a bottom gate of a thin film transistor, disposed on a substrate;
   a bottom gate insulating layer, disposed on the substrate and covering the bottom gate;
   a semiconductor oxide layer, disposed on the bottom gate insulating layer;
   an etch blocking layer, disposed on the bottom gate insulating layer and covering the semiconductor oxide layer, wherein the etch blocking layer comprises a first via, a portion of the semiconductor oxide layer is exposed through the first via;
   a drain and a source of the thin film transistor, disposed on the etch blocking layer, the drain contacting with the semiconductor oxide layer through the first via;
   an insulating protection layer, disposed on the etch blocking layer and covering the drain and source;
   a second via, arranged in the insulating protection layer, the etch blocking layer and the bottom gate insulating layer, a portion of the bottom gate being exposed through the second via; and
   a top gate, disposed on the insulating protection layer and the top gate contacting with the bottom gate through the second via.

2. The thin film transistor array substrate according to claim 1, wherein the semiconductor oxide layer comprises an amorphous indium gallium zinc oxide.

3. The thin film transistor array substrate according to claim 1, wherein the bottom gate comprises at least one metal material.

4. The thin film transistor array substrate according to claim 1, wherein material used by the top gate and a pixel electrode are the same.

5. The thin film transistor array substrate according to claim 3, wherein material used by the top gate and a pixel electrode are the same.

6. The thin film transistor array substrate according to claim 4, wherein the pixel electrode comprises an indium tin oxide.

7. The thin film transistor array substrate according to claim 5, wherein the pixel electrode comprises an indium tin oxide.

* * * * *